United States Patent [19]
Mostowy et al.

[11] Patent Number: 5,539,998
[45] Date of Patent: Jul. 30, 1996

[54] HIGH PURITY BULK CHEMICAL DELIVERY SYSTEM

[75] Inventors: Lewis J. Mostowy, Fogelsville; Naser M. Chowdhury, Schnecksville, both of Pa.

[73] Assignee: Air Products and Chemicals, Inc., Allentown, Pa.

[ * ] Notice: The term of this patent shall not extend beyond the expiration date of Pat. No. 5,359,787.

[21] Appl. No.: 303,986

[22] Filed: Sep. 9, 1994

Related U.S. Application Data

[63] Continuation-in-part of Ser. No. 49,042, Apr. 16, 1993, Pat. No. 5,359,787.

[51] Int. Cl.$^6$ ............................................. F26B 3/00
[52] U.S. Cl. ........................... 34/343; 34/92; 34/404; 34/559; 62/238.3
[58] Field of Search ................................ 62/92, 93, 94, 62/271, 238.3; 34/9, 12, 60, 68, 69, 71, 95, 329, 343, 345, 347, 356, 380, 402–404, 467, 472, 406, 410, 412, 558–559

[56] References Cited

U.S. PATENT DOCUMENTS

| | | | |
|---|---|---|---|
| 4,532,778 | 8/1985 | Clark et al. | 62/238.3 |
| 4,853,148 | 8/1989 | Tom et al. | 252/194 |
| 5,137,047 | 8/1992 | George | 137/240 |
| 5,148,945 | 9/1992 | Geatz | 222/1 |
| 5,359,787 | 11/1994 | Mostowy, Jr. et al. | 34/343 |

OTHER PUBLICATIONS

Paul M. Bhadha and Everett R. Greene. "Joule–Thomson Expansion and Corrosion in HCl Systems." *Solid State Technology* Jul. 1992:S3–S7.

*Primary Examiner*—John T. Kwon
*Attorney, Agent, or Firm*—Geoffrey L. Chase

[57] ABSTRACT

An apparatus and method are described for delivering hygroscopic, corrosive chemicals such as hydrogen chloride from a source such as a tube trailer to a use point such as a semiconductor fabrication tool minimizing infiltration of moisture, and entrainment of particulates, while still reducing moisture contents below 100 parts per billion and achieving appropriate pressure drops without two phase flow.

22 Claims, 2 Drawing Sheets

5,539,998

HIGH PURITY BULK CHEMICAL DELIVERY SYSTEM

This application is a continuation-in-part of U.S. Pat. No. 5,359,787.

TECHNICAL FIELD

The present invention is directed to an apparatus and process for delivering a hygroscopic, corrosive chemical, such as hydrogen chloride, from a source of supply, such as a tube trailer, to a use point, such as a semiconductor fabrication tool. More specifically, the present invention is directed to such a delivery apparatus and process wherein contamination with moisture is minimized, in situ moisture is substantially removed and single phase gas flow is achieved so as to minimize corrosion created by such moisture and the entrainment of metals or particular contaminants which the liquid form of such moisture could achieve.

BACKGROUND OF THE PRIOR ART

Hygroscopic, corrosive chemicals are frequently used in sophisticated semiconductor fabrication processes. Typical of such a chemical is anhydrous hydrogen chloride which is a colorless gas which fumes strongly in moist air. Bulk hydrogen chloride is shipped in tube trailers or Y-cylinders as a liquified compressed gas under a vapor pressure of 613 psig at 70° F. Chemically, hydrogen chloride is non-corrosive in the anhydrous state. However, hydrogen chloride readily adsorbs water to yield highly corrosive hydrochloric acid, which can attack metals and other equipment, such as the containment and delivery systems, meant to provide hydrogen chloride to semiconductor fabrication facilities.

It is known to provide apparatus and methods for transfer and delivery of high purity chemicals as is set forth in U.S. Pat. No. 5,148,945, including hydrochloric acid. The patent uses vacuum to initially fill a reservoir which is subsequently pressurized with inert gas to deliver chemical to the end use application.

U.S. Pat. No. 5,137,047 discloses a process for delivery of reactive gases to a semiconductor fabrication area using a pigtail having reduced dead volume and a vacuum system which allows for purge and evacuation of the delivery system. The patent is specifically directed to the delivery of tungsten hexafluoride.

U.S. Pat. No. 4,853,148 discloses a process and composition for drying gaseous hydrogen halides, such as hydrogen chloride using a metal halide or metal halide supported on a substrate or resin.

In an article "Joule-Thomson Expansion and Corrosion in HCL System", by Paul M. Bhadha, et al. appearing in *Solid State Technology*, July 1992, pages S3 through S7, a discussion of the formation of liquid in conveyance of HCL through various pressure drop mechanisms is disclosed and techniques including heating are described for avoidance of such condensation, which otherwise facilitates higher rates of corrosion.

U.S. Pat. No. 4,532,778 discloses a process for recycling aqueous sulfuric acid in which the sulfuric acid is heated and separated from contained water before recycling to the reservoir of the aqueous sulfuric acid. This cycle is part of a chemical heat pump.

Presently, the industry engaged in high flow hydrogen chloride delivery for semiconductor fabrication attempts to provide high purity in hydrogen chloride using sophisticated alloys having greatly reduced corrosion rates in conjunction with traditional materials of construction. Despite the use of such alloys, such as Hastelloy, the industry has experienced corrosion of hydrogen chloride delivery systems, unstable process control and increased levels of impurity in delivered hydrogen chloride comprising either moisture or metal entrainment. The present invention overcomes these shortcomings of the prior art using a unique integration of various pieces of apparatus and processes taking into account sources of corrosion and the methods for metal entrainment in hydrogen chloride delivery, wherein the present invention enjoys the capability of delivering high purity hygroscopic, corrosive chemicals, such as hydrogen chloride, with extremely low moisture levels and extremely low levels of impurity, such as metal contaminants, below which the industry has generally been able to achieve. Such objectives are achieved by the present invention as set forth in greater detail below.

BRIEF SUMMARY OF THE INVENTION

The present invention is an apparatus for transfer and delivery of a hygroscopic, corrosive chemical from an elevated pressure source of supply to a lower pressure use point, comprising:

(a) a delivery conduit for connection to a source of supply of the chemical and to the use point;

(b) a dehydrator connected in the delivery conduit for removing moisture from the chemical passing through the conduit;

(c) at least one pressure regulator connected in the delivery conduit to reduce the pressure from the elevated pressure source of supply to the lower pressure use point;

(d) at least one means to heat the chemical passing through the at least one pressure regulator; and (e) a vacuum means for evacuating the delivery conduit in an operation of connecting the delivery conduit to the source of supply and/or the use point.

Preferably, the vacuum means includes means for providing a purge gas to the delivery conduit from a purge gas source and removal of the purge gas from the delivery conduit.

More preferably, the vacuum means comprises a vacuum pump connected to a delivery conduit by vacuum conduit and further connected to a scrubber means, a purge gas source connected to said delivery conduit by a purge gas conduit and means for controlling the evacuation and purging of the delivery conduit by the vacuum pump.

Preferably, the apparatus includes means for sensing the ambient temperature at the source of supply, means for sensing the temperature of the chemical transferred from the source of supply, means for sensing a rate of pressure decline in the source of supply, means to compare the sensed temperature and sensed pressure decline against preset values, indicative of the chemical being substantially in a gas phase and means for generating an alarm signal when the sensed values indicate the chemical in the source of supply is in the gas phase.

Alternatively, the apparatus includes means for inputting data representing the volume of the source of supply, means for sensing the weight of the source of supply, means for sensing the ambient temperature at the source of supply and/or the temperature of the chemical, means to compare the volume, weight and temperature values against preset values indicative of the chemical in the source of supply approaching a substantially gas phase and means for generating an alarm signal when the input and sensed values indicate the chemical in the source of supply is approaching substantially a gas phase.

Preferably, the delivery conduit includes bellows valves for controlling delivery of the chemical from the source of supply.

Preferably, the delivery conduit includes bellows valves for controlling delivery of purge gas to the delivery conduit.

Preferably, the delivery conduit includes bellows valves for controlling a connection of the vacuum means to the delivery conduit.

Preferably, the pressure regulator is a diaphragm regulator fabricated from high purity bar stock material.

Preferably, the delivery conduit is constructed substantially of welded electro-polished 316L stainless steel.

Preferably, the dehydrator is a bed of metal halide which is selective for the adsorption of moisture from the chemical.

Alternatively, the dehydrator is a bed of molecular sieve which is selective for the adsorption of moisture from the chemical.

The present invention is also a process for transferring and delivering a hygroscopic, corrosive chemical from an elevated pressure source of supply to a lower pressure use point, comprising:

(a) conveying the chemical from the source of supply to a delivery conduit by operation of an appropriate valve;

(b) removing moisture from the chemical by passage of the chemical through a dehydrator;

(c) heating the chemical and reducing pressure of the source of supply to a lower pressure of the use point by passage through at least one pressure regulator; and (d) delivering the chemical at reduced pressure to a use point of substantially dehydrated single-phase gaseous condition.

Preferably, the delivery conduit is purged with an inert dry gas and evacuated with a vacuum pump before connecting the delivery conduit to the source of supply and/or the use point.

More preferably, upon connecting the delivery conduit to the source of supply and/or the use point, the delivery conduit is operated through the series of steps comprising:

(a) initially purging with the inert dry gas;

(b) venting to remove the gas;

(c) evacuating to a sub-ambient pressure;

(d) pressure sensing to determine the sub-ambient pressure level achieved in step (c);

(e) if the desired sub-ambient pressure is not achieved, returning to step (a) initially purging;

(f) if the desired sub-ambient pressure is obtained, the delivery conduit is sensed for maintaining a selected pressure increase over a selected time interval;

(g) if the selected pressure increase is exceeded, returning to step (c), evacuation;

(h) if the selected pressure increase is not exceeded, conveying the chemical through the delivery conduit and venting it;

(i) purging with the inert dry gas;

(j) cycling through steps (c)–(f) again; and (h) opening the delivery conduit to convey the chemical from the source of supply to the use point.

Preferably, the chemical is selected from the group consisting of hydrogen chloride, hydrogen bromide, hydrogen fluoride, hydrogen iodide for mixtures thereof.

Preferably, the dehydrator is a bed of metal chloride selected for removal of moisture from the chemical.

Alternatively, the dehydrator is a bed of molecular sieve selected for removal of moisture from the chemical.

Preferably, the ambient temperature at the source of supply is sensed, the temperature of the chemical transferred from the source of supply is sensed, the rate of pressure decline of the chemical in the source of supply is sensed, the sensed temperatures and sensed rate of pressure decline are compared with preset values representative of a substantially gas phase and generating an alarm signal when the sensed values indicate the chemical in the source of supply is in the gas phase.

Alternatively, the volume of the source of supply is determined, the weight of the source of supply is sensed, the ambient temperature at the source of supply is sensed and/or the temperature of the chemical is sensed, the values for the volume, weight and temperature are compared against preset values indicative that the chemical in the source of supply is approaching a substantially gas phase and an alarm signal is generated when the determined and sensed values indicate the chemical in the source of supply is approaching a substantially gas phase.

DETAILED DESCRIPTION OF THE DRAWINGS

DETAILED DESCRIPTION OF THE INVENTION

Figure 1:
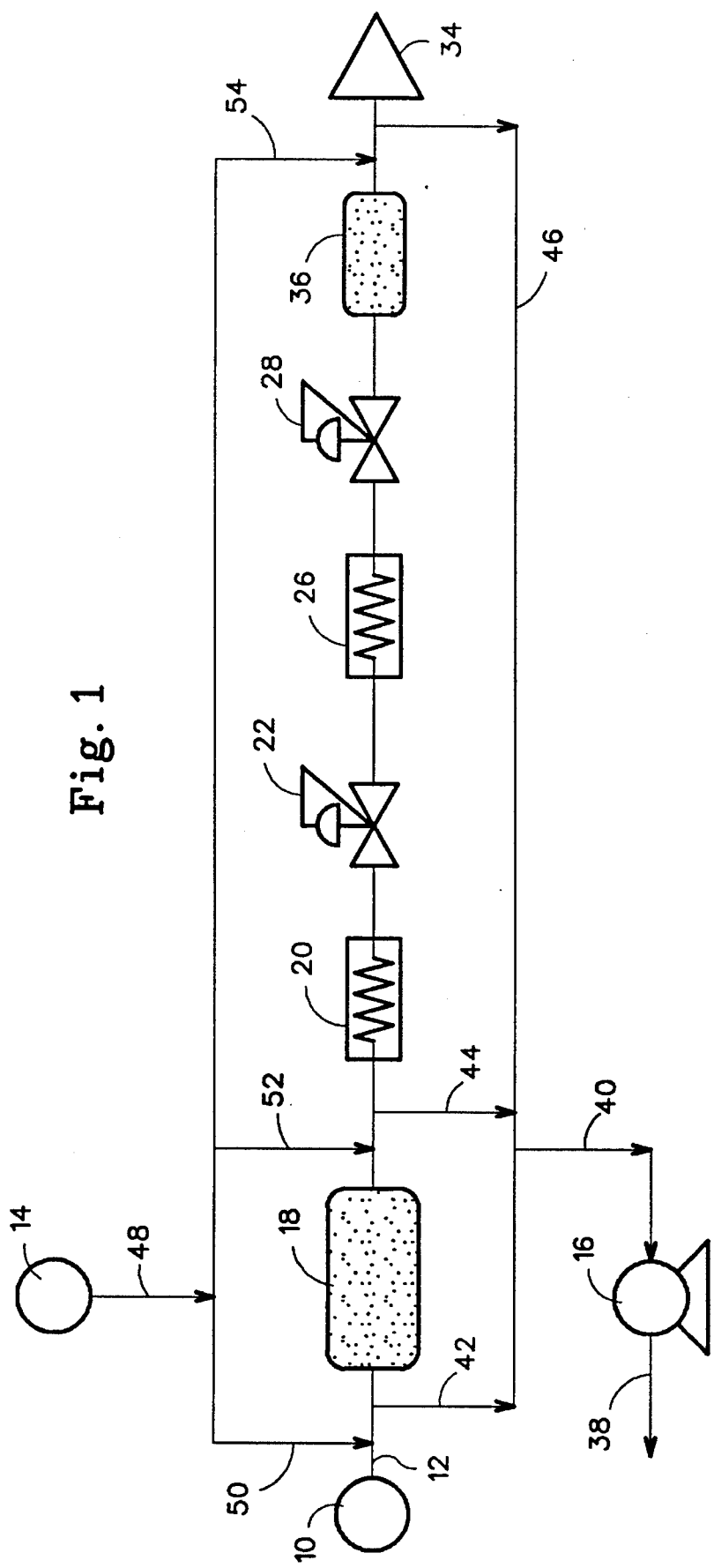
FIG. 1 is a schematic illustration of a preferred embodiment of the chemical transfer and delivery apparatus and process of the present invention.

The present invention of an apparatus for transfer and delivery of a hygroscopic, corrosive chemical, such as hydrogen chloride, is designed to continuously flow the gaseous chemical from a source of supply, such as a tube trailer, to an end use customer's house line at preferably a maximum flow rate of 10,000, more preferably 3,000 standard cubic feet per hour (at 70° F. for hydrogen chloride). The maximum flow rate is limited by the lower temperature limit (−20° F.) of the tubes of the tube trailer occurring due to the expansion of gas based upon flow out of the tube trailer to the customer house line. Corresponding tube pressure at this low temperature is approximately 155 psig. The present invention is particularly appropriate to flow rates in excess of 100 standard cubic feet per hour, preferably 300 standard cubic feet per hour wherein pressure drops and the Joule-Thompson effect are pronounced and would otherwise create condensation and two-phase flow.

The apparatus of the present invention is designed with the use of high purity piping components for the delivery conduit consisting of 316 L stainless steel, which is electropolished and uses welded construction and/or metal to metal seal fittings. Chemical from the tube trailer source of supply will flow through a dehydrator to remove moisture to ultra low levels. Automatic vacuum purging of the apparatus including the delivery conduit and the dehydrator are accomplished using a vacuum pump and a programmable controller to prevent introduction of atmospheric contaminants into the apparatus, thereby maintaining high purity of the chemical and reducing corrosion of the apparatus in the presence of moisture and more particularly liquid moisture. Bellows sealed globe valves are used to control flow through the delivery conduit in conjunction with diaphragm gas regulators. A sintered metal filter is provided to remove any particulate contaminants.

The piping system is critical to minimizing intrusion of moisture from ambient environments where the apparatus will be operated. The integrity of the delivery conduit will minimize contamination and moisture.

In addition, residual amounts of moisture exist in most high purity chemicals, such as electronic grade hydrogen chloride. Typical moisture content guarantees are below 1 ppm of water. However, even this level of moisture content can be detrimental to delivery systems and create corrosion, particularly in the event of lowering temperatures to condensation points downstream of pressure drops in such delivery systems. Therefore, it is important to reduce moisture contents of delivered chemicals, such as hydrogen chloride, below existing bulk specifications to avoid corrosion in delivery systems and to meet more demanding semiconductor fabrication demands which can be as low as less than 100 ppb moisture levels.

In order to reduce the existing low levels of moisture in a chemical, such as hydrogen chloride, the apparatus of the present invention includes a dehydrator using a moisture scavenging desiccant material, such as magnesium chloride on an alumina support or a molecular sieve, such as 3A or 5A zeolite. An appropriate dehydrator is comprised of a vessel containing a bed of a metal halide, either supported or unsupported, on a support such as alumina or an appropriate resin. Such a dehydrator is described in U.S. Pat. No. 4,853,148 which is hereby incorporated herein in its entirety. Although the preferred embodiment of the present invention is described with the dehydrator preceding any pressure reduction, it is contemplated that the dehydrator could be located downstream of pressure reduction equipment, such as a pressure regulator. The dehydrator function can also be performed by a device that acts as a purifier which not only removes moisture, but also other trace contaminants, such as; trace metals like arsenic, iron, molybdenum, as well as oxygen and phosphorus. Such a purifier could be accomplished using a multilayered bed with layers specific to the trace contaminant to be removed.

Because the source of supply, such as a tube trailer, is subject to being connected and disconnected from the apparatus, and particularly the delivery conduit periodically for changeout, as well as the tool constituting the use point or delivery connection with the delivery conduit, the present apparatus is designed with a source of purge gas and a vacuum pump means for removing contaminants, moisture and residual chemical, such as hydrogen chloride, from the apparatus with delivery of the evacuated material to an appropriate scrubber typically located at the site of a semiconductor fabrication facility such as the present apparatus would be used. The vacuum purging system comprises a vacuum pump operated in conjunction with a controller programmed for auto-purging and evacuation. Vacuum pumps can be selected from the rotary vain type, rotary piston, diaphragm, molecular drag type and dry pumps.

The apparatus of the present invention uses heaters or heat taped lines in the delivery conduit to minimize the formation of two-phase flow comprising a gaseous hydrogen chloride phase and a liquid hydrogen chloride phase which occurs at various areas of pressure drop through the high gas flow delivery conduit wherein lower temperatures are experienced due to the Joule-Thomson effect. Specifically, upstream of the one or more pressure regulators in the delivery conduit are located electric resistance heaters or other forms of heat input to warm the flow of chemical passing through the pressure regulator so that temperatures above the condensation level of moisture or other contaminants are maintained downstream of the regulator. To further ensure maintenance of one phase gaseous flow in the delivery conduit, portions of the delivery conduit downstream of the regulator are heated with means such as heat tape or heat tracing.

The avoidance of condensation of in situ or infiltrated moisture, even at relatively low levels, is important because corrosion exists in delivery conduits carrying corrosive gases, such as hydrogen chloride, only where moisture is able to condense out as a liquid phase media. Therefore, although it is desirable to maintain moisture levels as low as possible and presumably at the detection level of moisture in the corrosive chemical flowing through the delivery conduit, absent such minimal content of moisture, it is also desirable to avoid existing moisture from condensing out and accumulating at various parts of the apparatus where it can attack the materials of construction based upon its admixture with the hydrogen chloride (one form of the corrosive chemical) to form such corrosive products as hydrochloric acid or other acids of hydrogen halides. Avoidance of moisture and two-phase flow in the chemical passing through the delivery conduit is also beneficial because two phase flow tends to entrain particles, contaminants and metals from the materials of construction in the flow of the chemical through the delivery conduit. In addition, corrosion formed by the existence of moisture is then entrained in the chemical flow when additional two phase flow captures particles of such corrosion and passes them through the delivery conduit. Appropriately, avoidance of two-phase flow of a corrosive chemical is important to avoid corrosion of the materials of construction of the apparatus, as well as avoiding entrainment and therefore particle contamination of the chemical as it is delivered to the use point, which in the case of semiconductor fabrications requires ultra-high purities.

The present invention also provides a sensing and alarm feature to determine and report by alarm the condition of liquid dry point. Liquid dry point is the condition when pressurized liquid chemical, such as hydrogen chloride, provided in the tube trailer is slowly vaporized for saturated gaseous supply. A physical state ultimately occurs where all of the liquid has been vaporized and the residual chemical still under elevated pressure is entirely in an unsaturated, single phase gas phase, wherein the pressure decays or declines rapidly thereafter. While substantially reasonable amounts of the chemical are in the liquid phase, the pressure upon release and delivery of gaseous chemical remains relatively stable and the chemical vaporizes as a saturated gas.

Moisture and leached volatile metals levels can typically increase significantly after the liquid dry point is reached in chemicals, such as hydrogen chloride, because the moisture and volatile metals are retained in the liquid phase while hydrogen chloride preferentially vaporizes in ultra-dry condition during transfer and delivery to the use point. Upon obtaining the liquid dry point where a liquid is no longer present, the moisture and any volatile metals are free to pass with the delivered chemical to the use point. This not only increases the amount of moisture and any volatile metals being delivered, but because the moisture and any volatile metals have been concentrating during dispensing in the shrinking volume of liquid supply, when the liquid dry point is reached, higher than normal levels of moisture or any volatile metals are experienced in the delivery of the final gaseous phase chemical from the source of supply or tube trailer. It is therefore appropriate to detect the approach or obtaining of the liquid dry point condition.

In the present invention, appropriate sensors, such as thermocouples and pressure transducers, are provided for the source of supply or tube trailer as well as ambient temperature conditions so that the ambient temperature at the tube trailer or source of supply is sensed, the temperature of chemical from the tube trailer or source of supply is sensed and the relative change in pressure over selected time intervals is sensed and transmitted to an appropriate digital computational controller. These values are compared against preset values for ambient temperature, source of supply temperature and pressure decay, indicative of the liquid dry point (gas phase), and when the sensed values exceed the prescribed preset values which indicate the liquid dry point is reached, the controller provides an appropriate alarm signal which may be an audible siren, a visual light or a report on a computer system or any combination of such features.

Alternatively, the liquid dry point can be calculated by determining and inputting to the digital computational controller the volume of the tube trailer, the weight of the trailer during transfer of the chemical and the ambient temperature at the tube trailer, as well as the temperature of the chemical leaving the tube trailer and entering the delivery conduit. Again, these values are compared to preset values already input into the controller which represent approach to substantially gas phase of the chemical (meaning that at least some small amount of chemical is still in the liquid phase). When the sensed values meet or exceed the preset values so as to indicate the approach to the liquid dry point (substantially a gas phase), the system generates an alarm signal.

The present invention will now be described with regard to a particular preferred embodiment as illustrated with regard to FIG. 1. A source of supply 10 of an appropriate hygroscopic, corrosive chemical, such as hydrogen chloride, contained at elevated pressure is temporarily connected to a delivery conduit 12 which conveys the chemical to a use point 34 which comprises typically an appropriate tool using the chemical, such as hydrogen chloride, in a semiconductor fabrication facility.

Prior to connection of the source of supply 10 to the delivery conduit 12 and, in order to ensure low moisture and low contamination of the delivery conduit 12, the delivery conduit 12 is subjected to purge with any suitable dry inert gas from a purge gas source 14, such as a VLSI grade cylinder of argon. This purge gas is introduced through manifold 48 and various valved lines 50, 52 and 54 to various critical areas of the delivery conduit 12 for purging the delivery conduit and other stations along the delivery conduit of any contained moisture chemical or other contaminant. Additionally, the argon purge is used to avoid entrainment of atmospheric air into the delivery conduit during connection of the source of supply 10 to the conduit 12.

Purge gas and contaminants are removed from the delivery conduit 12 through any one of the series of valved and separately controlled vacuum lines 42, 44 and 46. These lines are manifolded through line 40 which connects with the vacuum pump 16. Contaminants and purge gas are withdrawn through a vacuum pump 16 and sent to a separate scrubbing system not illustrated nor comprising a part of this invention through line 38. The vacuum pump may be protected from corrosive chemicals by appropriate placement of a filter upstream of the vacuum pump, which again is not illustrated. The purge and evacuation of the apparatus can be accomplished through an automated sequence described below which is controlled by an appropriate digital programmable controller.

Corrosive chemical from the source of supply 10 passing through the initial portion of the delivery conduit 12 enters a dehydrator 18 where any contained moisture is removed on appropriate desiccant material contained in the dehydrator 18. A preferred dehydrator is a metal halide, either supported or unsupported contained in a packed bed through which the chemical in the delivery conduit must flow. An appropriate device is described in U.S. Pat. No. 4,853,148 as set forth above. The metal halide contained within the dehydrator forms hydrates with the moisture being removed from the chemical. Preferably, in order to preserve the high purity of the chemical being dried, such as hydrogen chloride, the halide constituent of the metal halide is the same as the halide of the hydrogen halide being treated in the case of hydrogen chlorides, hydrogen bromides, hydrogen fluorides and hydrogen iodide. The dehydrator 18 may be replaced at periodic intervals when it has reached its capacity for moisture. Alternatively, the dehydrator can be a bed of molecular sieve material that is selective to adsorption of moisture or a pair of switching beds of molecular sieve, which affords the opportunity of regenerating the beds by taking one off-line while the other bed performs drying of the chemical flowstream.

The corrosive chemical from the source of supply 10 is at elevated pressure and must be reduced in pressure through one or more pressure regulators in order to be at the appropriate designed pressure specification for the use point 34. Because the drop in pressure will effect cooling by the Joule-Thomson effect, the delivery conduit is connected to a heater 20 which heats the chemical prior to passage through a diaphragm style pressure regulator 22 which initially drops the conveyed chemical in pressure and optionally passes through a post-heat portion of the delivery conduit 12, wherein the conduit is heat traced with heat tape.

Depending upon the pressure parameters, the chemical is further heated in heater 26 before being dropped through a final pressure decrease in diaphragm style pressure regulator 28, again creating cooling by the Joule-Thomson effect which is avoided by a heat traced portion of the delivery conduit 12 using heat tape.

The chemical is then passed through a porous sintered metal filter 36 which captures any entrained particulates.

This embodiment describes the dehydrator preceding the pressure regulators, but it is also contemplated that the dehydrator could be located after one or more of any pressure regulators.

The chemical, above the condensation temperature of moisture and at the appropriate designed pressure specifications, is then provided to an appropriate use point 34 comprising a tool in the semiconductor fabrication facility. In the event of hydrogen chloride being the chemical, the delivered hydrogen chloride is at the lower pressure design point and at minimal moisture content in a single-phase gaseous form. The apparatus including the delivery conduit 12, the dehydrator 18 and the various pressure regulators 22 and 28, as well as the subordinate heaters 20 and 26 and filter 36 can be subject to purge and evacuation for removal of contaminants, residual chemical and any infiltrating moisture through the automated operation of the purge apparatus and manifold lines, as well as the vacuum pump apparatus and manifold lines.

Figure 2:
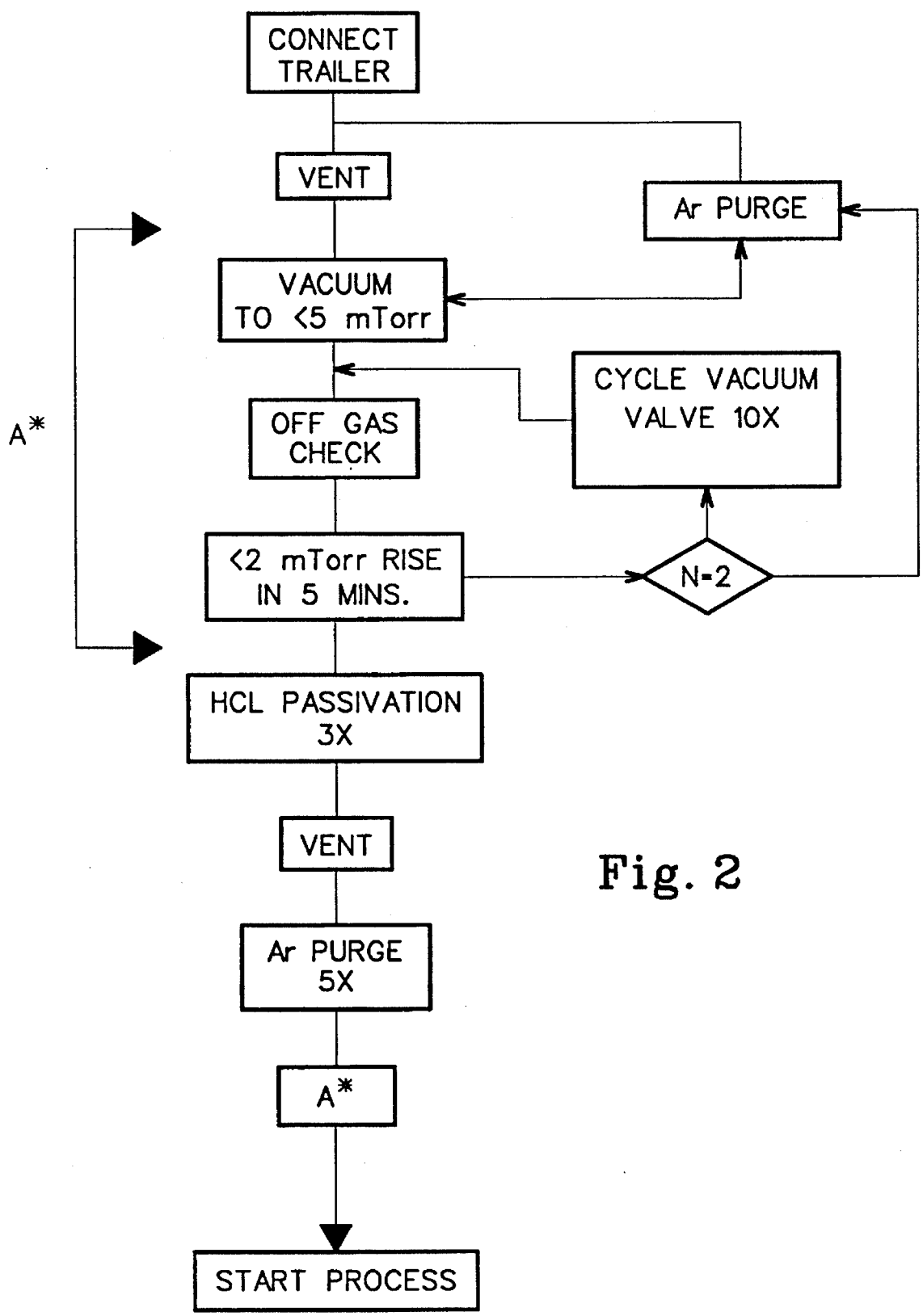
FIG. 2 is a flowchart of the process logic for venting and purging the apparatus of the present invention.

FIG. 2 sets forth a depiction of the logic for the automated operation of the purge and vacuum apparatus. Starting from the top of the figure, at such time as a source of supply, such as a tube trailer, is connected to the delivery conduit, the conduit is under a purge of approximately 5 psig of argon purge gas to avoid atmospheric contamination. After connection, the apparatus comprising the delivery conduit and other connected apparatus is vented and subject to a vacuum, down to less than 5 millitorr. At this point, vacuum condition in the delivery conduit is sensed and if the lower threshold vacuum level (less than 5 m Torr) is not achieved the system automatically returns to producing an argon purge and continuation of the vent and vacuum stage. However, if the vacuum condition is met, the system then checks for retention of the vacuum condition in what is termed an off-gas check. If there is more than a 2 millitorr rise in pressure over the course of 5 minutes, the system automatically cycles through a valve sequence connecting the vacuum to the delivery conduit in a series of 10 openings and closings and again checks for an off-gas check or pressure rise which would evidence insufficient vacuum valve actuation.

In a subsequent check for the retention of less than a 2 millitorr rise in 5 minutes, if the system does not exceed that minimal rise, the system automatically returns to the argon purge prior to initiating the entire sequence described to this point. In the event that the system senses no greater than a 2 millitorr rise in the course of 5 minutes, the delivery conduit and the appropriate other apparatus are then subjected to chemical passivation, which in the preferred embodiment for operation of delivery of hydrogen chloride, would be a hydrogen chloride passivation. This is the passage of hydrogen chloride from the source of the supplying tube trailer through the delivery conduit in an appropriate apparatus to scavenge residual moisture through the operation of interaction with the hydrogen chloride, taking it from the anhydrous condition to a more hydrated condition. This is conducted three times with venting of the appropriate discharges of hydrogen chloride from the source of supply, as well as any included hydrates or hydrous hydrogen chloride formed so as to essentially scavenge moisture from the delivery conduit. This material is vented through the vacuum system.

The delivery conduit is subjected to five iterations of argon purge at 30 to 50 psig, again discharged to the vacuum system. The system is then subjected to a vacuum checked to less than 5 millitorr, with a subsequent off-gas check sensing whether there is less than a 2 millitorr rise in 5 minutes, as described above, with the bracketed portion of the logic identified with regard to the "A" designation. If all systems are appropriately checked out, the process is started by delivery of chemicals, such as hydrogen chloride, from a source of supply, such as a tube trailer, through the delivery conduit to the use point via the dehydrator, various heaters, several pressure regulators and the filter. Valving for all portions of the system are provided through appropriate pneumatic controls with manual override in a bellows type globe valve, the valves of which are not illustrated for purpose of this invention in either FIG. 1 or FIG. 2.

The unique integration of the present invention provides an automated apparatus and method to deliver electronic grade chemicals, such as hydrogen chloride, from a typical one part per million moisture level from a tube trailer to a use point demanding 100 parts per billion moisture level in a single phase gas formed without entraining additional particulate contaminants or metals by avoidance of moisture infiltration or condensation of moisture within the system. This is achieved in an ultra high purity piping system which allows for appropriate pressure drops to point of use pressures without incurring the detriment of condensing residual in situ moisture. In addition, in a particular embodiment, the present invention achieves an alarm signal to detect a liquid dry point status where conditions under which potential moisture and volatile metal spikes of elevated levels can be detected and avoided prior to chemical entering the system. The overall effect is that the apparatus and method of the present invention avoids significant corrosion of materials of construction of the delivery apparatus and avoidance of contamination and moisture content of delivered chemical which far surpasses the capabilities of prior systems which repeatedly fail for reasons of high corrosion, two phase flow and entrainment of particulates, such as metals.

The present invention has been set forth with regard to several preferred embodiments, however, the full scope of the invention should be ascertained from the claims which follow.

We claim:

1. An apparatus for transfer and delivery of a hygroscopic, corrosive chemical from an elevated pressure source of supply to lower pressure use point, comprising;
   (a) a delivery conduit for connection to said source of supply of said chemical and to said use point;
   (b) a dehydrator connected in said delivery conduit for removing moisture from said chemical passing through said conduit;
   (c) at least one pressure regulator connected in said delivery conduit to reduce the pressure from said elevated pressure source of supply to said lower pressure use point;
   (d) at least one means to heat said chemical passing through said at least one pressure regulator; and
   (e) a vacuum means for evacuating said delivery conduit in an operation of connecting said delivery conduit to said source of supply and/or said use point.

2. The apparatus of claim 1 wherein said vacuum means includes means for providing a purge gas to said delivery conduit from a purge gas source and removal of said purge gas from said delivery conduit.

3. The apparatus of claim 2 wherein said vacuum means comprises a vacuum pump connected to said delivery conduit by a vacuum conduit and further connected to a scrubber means, a purge gas source connected to said delivery conduit by a purge gas conduit, and means for controlling the evacuation and purging of said delivery conduit by said vacuum pump.

4. The apparatus of claim 1, including means for sensing the ambient temperature at said source of supply, means for sensing the temperature of said chemical transferred from said source of supply, means for sensing a rate of pressure decline in said source of supply, means to compare the sensed temperature and the sensed pressure decline against preset valves, indicative of the chemical in said source of supply being substantially in a gas phase and means for generating an alarm signal when sensed values indicate said chemical in said source of supply is in a gas phase.

5. The apparatus of claim 1, including means for inputting data representing the volume of the source of supply, means for sensing the weight of the source of supply, means for sensing the ambient temperature at the source of supply, the temperature of said chemical, or both the ambient temperature at the source of supply and the temperature of said chemical, means to compare volume, weight and temperature values against preset values indicative of said chemical in said source of supply is approaching substantially a gas phase and means for generating an alarm signal when input and sensed values indicate said chemical in said source of supply is approaching substantially a gas phase.

6. The apparatus of claim 1 wherein said delivery conduit includes bellows valves for controlling delivery of said chemical from said source of supply.

7. The apparatus of claim 2 wherein said delivery conduit includes bellows valves for controlling delivery of said purge gas to said delivery conduit.

8. The apparatus of claim 1 wherein said delivery conduit includes bellows valves for controlling connection of said vacuum means to said delivery conduit.

9. The apparatus of claim 1 wherein said pressure regulator is a diaphragm regulator fabricated from high purity bar stock material.

10. The apparatus of claim 1 wherein said delivery conduit is constructed substantially of welded electro-polished 316L stainless steel.

11. The apparatus of claim 1 wherein said dehydrator is a bed of metal halide which is selective for the adsorption of moisture from said chemical.

12. The apparatus of claim 1 wherein said dehydrator is a bed of molecular sieve which is selective for the adsorption of moisture from said chemical.

13. The apparatus of claim 1 wherein said dehydrator is located upstream of said pressure regulator.

14. The apparatus of claim 1 wherein said dehydrator is located downstream of said pressure regulator.

15. A process for transferring and delivering a hygroscopic, corrosive chemical from an elevated pressure source of supply to a lower pressure use point, comprising;
   (a) conveying said chemical from said source of supply to a delivery conduit by operation of an appropriate valve;
   (b) removing moisture from said chemical by passage of the chemical through a dehydrator;
   (c) heating said chemical and reducing the pressure on the chemical from substantially an elevated pressure of said source of supply to a lower pressure of said use point by passage through at least one pressure regulator;
   (d) delivering said chemical at reduced pressure to a use point in a substantially dehydrated single phase gaseous condition.

16. The process of claim 15 wherein said delivery conduit is purged with an inert dry gas and evacuated with a vacuum pump before connecting said delivery conduit to said source of supply, said use point, or both said source of supply and said use point.

17. The process of claim 15 wherein, upon connecting said delivery conduit to said source of supply, said use point, or both said source of supply and said use point, said delivery conduit is operated through the series of steps comprising:
   (a) initially purging with said inert dry gas;
   (b) venting to remove said gas;
   (c) evacuating to a subambient pressure;
   (d) pressure sensing to determine the subambient pressure level achieved in step (c);
   (e) if the desired subambient pressure is not achieved, returning to step (a), initially purging;
   (f) if the desired subambient pressure is obtained, said delivery conduit is sensed for maintaining a selected pressure increase over a selected time interval;
   (g) if said selected pressure increase is exceeded, returning to step (c), evacuation;
   (h) if said selected pressure increase is not exceeded, conveying said chemical through said delivery conduit and venting it;
   (i) purging with said inert dry gas;
   (j) cycling through steps (c)–(f) again;
   (k) opening said delivery conduit to convey said chemical from said source of supply to said use point.

18. The process of claim 15 wherein said chemical is selected from the group consisting of hydrogen chloride, hydrogen bromide, hydrogen fluoride, hydrogen iodide or mixtures thereof.

19. The process of claim 15 wherein said dehydrator is a bed of a metal chloride selective for removal of moisture from said chemical.

20. The process of claim 15 wherein said dehydrator is a bed of a molecular sieve selective for removal of moisture from said chemical.

21. The process of claim 15 wherein the ambient temperature at said source of supply is sensed, the temperature of said chemical transferred from said source of supply is sensed, the rate of pressure decline of said chemical in said source of supply is sensed, the sensed temperatures and sensed rate of pressure decline are compared with preset values representative of a substantially gas phase, and generating an alarm signal when sensed values indicate said chemical in said source of supply is in the gas phase.

22. The process of claim 15 wherein: (a) the volume of the source of supply is determined, (b) the weight of the source of supply is sensed, (c) the ambient temperature at the source of supply is sensed, the temperature of said chemical is sensed, or both the ambient temperature at the source of supply and the temperature of said chemical is sensed, (d) the values for said volume, weight and temperatures are compared against preset values indicative that said chemical in said source of supply is approaching substantially a gas phase and (e) an alarm signal is generated when determined and sensed values indicate said chemical in said source of supply is approaching substantially a gas phase.

* * * * *